(12) United States Patent
Zhang et al.

(10) Patent No.: US 12,183,860 B2
(45) Date of Patent: Dec. 31, 2024

(54) FULL-COLOR LIGHT EMITTING DEVICE AND DISPLAY MODULE

(71) Applicant: FOSHAN NATIONSTAR OPTOELECTRONICS CO., LTD., Guangdong (CN)

(72) Inventors: Yunyuan Zhang, Guangdong (CN); Jinhui Zhang, Guangdong (CN); Yikai Yuan, Guangdong (CN); Cheng Li, Guangdong (CN)

(73) Assignee: FOSHAN NATIONSTAR OPTOELECTRONICS CO., LTD., Guangdong (CN)

( * ) Notice: Subject to any disclaimer, the term of this patent is extended or adjusted under 35 U.S.C. 154(b) by 411 days.

(21) Appl. No.: 17/623,268

(22) PCT Filed: Apr. 21, 2020

(86) PCT No.: PCT/CN2020/085978
§ 371 (c)(1),
(2) Date: Dec. 28, 2021

(87) PCT Pub. No.: WO2020/259037
PCT Pub. Date: Dec. 30, 2020

(65) Prior Publication Data
US 2022/0376147 A1    Nov. 24, 2022

(30) Foreign Application Priority Data
Jun. 28, 2019  (CN) .......................... 201910583699.1

(51) Int. Cl.
*H01L 33/50* (2010.01)
*H01L 25/075* (2006.01)
*H01L 33/60* (2010.01)

(52) U.S. Cl.
CPC ........ *H01L 33/504* (2013.01); *H01L 25/0753* (2013.01); *H01L 33/60* (2013.01)

(58) Field of Classification Search
CPC ... H01L 25/0753; H01L 33/50; H01L 25/075; H01L 33/60; G02B 6/005; G02B 6/0068;
(Continued)

(56) References Cited

U.S. PATENT DOCUMENTS 6,737,801 B2    5/2004  Ragle et al.
10,048,427 B2*  8/2018  Aoyagi ..................... F21V 9/08
(Continued)

FOREIGN PATENT DOCUMENTS

CN        1571595 A      1/2005
CN      107123723 A      9/2017
(Continued)

*Primary Examiner* — William J Carter
(74) *Attorney, Agent, or Firm* — Samson G. Yu (57) ABSTRACT

The disclosure provides a full-color light emitting device and a display module. A light emitting layer, a refractive layer, a spacer layer and a light processing layer are included. The refractive layer is disposed above the light emitting layer, the spacer layer is disposed above the refractive layer, and the light processing layer is disposed above the spacer layer. The light emitting layer includes a first light emitting part, a second light emitting part and a third light emitting part. The light processing layer includes a first light processing part, a second light processing part, and a third light processing part, and a baffle wall is disposed between any two adjacent light processing parts in the first light processing part, the second light processing part and the third light processing part. A light refractive index of the refractive layer is greater than a light refractive index of the spacer layer.

20 Claims, 2 Drawing Sheets

(58) Field of Classification Search
CPC ...... G02B 5/20; G02B 6/0023; G02B 6/0073; G02B 6/4201; G02B 6/4231; G02B 6/4214; G02B 6/4257
See application file for complete search history.

(56) References Cited

U.S. PATENT DOCUMENTS

| | | | |
|---|---|---|---|
| 10,700,246 B2 * | 6/2020 | Sim | H01L 33/504 |
| 2010/0141116 A1 * | 6/2010 | Nomura | B29D 11/00634 |
| | | | 313/498 |
| 2014/0264419 A1 * | 9/2014 | Kim | H01L 33/504 |
| | | | 428/690 |
| 2015/0277017 A1 * | 10/2015 | Aoyagi | F21V 9/08 |
| | | | 156/60 |
| 2015/0362165 A1 * | 12/2015 | Chu | H01L 33/32 |
| | | | 362/235 |
| 2017/0244010 A1 * | 8/2017 | Kim | G02B 5/208 |

FOREIGN PATENT DOCUMENTS

| | | |
|---|---|---|
| CN | 107195653 A | 9/2017 |
| CN | 108878626 A | 11/2018 |
| CN | 109216581 A | 1/2019 |
| CN | 110311027 A | 10/2019 |
| WO | 2018084919 A1 | 5/2018 |

\* cited by examiner

FULL-COLOR LIGHT EMITTING DEVICE AND DISPLAY MODULE

CROSS-REFERENCE TO RELATED APPLICATION(S)

The present disclosure claims priority to Chinese Patent Application No. 201910583699.1, filed to the China National Intellectual Property Administration on Jun. 28, 2019 and entitled "Full-color Light Emitting Device and Display Module", the disclosure of which is hereby incorporated by reference in its entirety.

TECHNICAL FIELD

The disclosure relates to a technical field of LED devices, in particular to a full-color light emitting device and a display module.

BACKGROUND

At present, there is a light emitting device in the industry, which integrates more than three monochromatic light emitting diodes in a single light emitting device. According to design requirements, a color processing part for processing a monochromatic light into three primary colored beams of light is disposed directly above the light emitting diodes. Generally, the color processing part is used for incident light rays to directly transmit or be excited to generate light rays of a specific color, and the full-color display of the light emitting device is implemented by controlling the light emission of different light emitting diodes in the light emitting device.

For the light emitting device, on the one hand, the light emitting diode has a certain light emission angle, and the light rays of the light emitting diode in a certain angle range will fall on the corresponding color processing part. Meanwhile, light emitting rays larger than a certain angle are prone to exciting other non-corresponding color processing parts, thus causing distortion of color generated by the LED device. On the other hand, a long-wavelength fluorescent material may absorb the light rays excited by a short-wavelength fluorescent material. When one of the color processing parts is excited by the light rays, the light rays with a specific color generated by the excitation may be absorbed by adjacent color processing parts and cause false excitation, thus causing distortion of color generated by the LED device.

SUMMARY

In order to overcome shortcomings of a light emitting device in prior art, the disclosure provides a full-color light emitting device and a display module. A light processing part of the full-color light emitting device is not prone to being mistakenly excited, and mistakenly excited light rays in the light processing part are not prone to transmitting, so that the full-color light emitting device has accurate color development, good display effect and good practicability.

Accordingly, the disclosure provides a full-color light emitting device. The full-color light emitting device includes a light emitting layer, a refractive layer, a spacer layer and a light processing layer.

The refractive layer is disposed above the light emitting layer, the spacer layer is disposed above the refractive layer, and the light processing layer is disposed above the spacer layer.

The light emitting layer includes a first light emitting part, a second light emitting part and a third light emitting part. The light processing layer includes a first light processing part emitting a blue light ray, a second light processing part emitting a green light ray and a third light processing part emitting a red light ray, and a baffle wall is disposed between any two adjacent light processing parts in the first light processing part, the second light processing part and the third light processing part.

The first light processing part is disposed at a position corresponding to the first light emitting part. The second light processing part is disposed at a position corresponding to the second light emitting part. The third light processing part is disposed at a position corresponding to the third light emitting part.

A light refractive index of the refractive layer is greater than a light refractive index of the spacer layer.

In some embodiments, the spacer layer is a vacuum layer, or the spacer layer is filled with colorless gas, or the spacer layer is filled with a material with a refractive index lower than the refractive index of the refractive layer.

In some embodiments, the refractive layer includes at least two sub-refractive layers. Refractive indexes of any two adjacent sub-refractive layers in the at least two sub-refractive layers are different, and a light refractive index of an uppermost sub-refractive layer in the at least two sub-refractive layers is greater than the light refractive index of the spacer layer.

In some embodiments, a light absorption material is disposed between any two adjacent light emitting parts in the first light emitting part, the second light emitting part and the third light emitting part.

In some embodiments, the baffle wall extends toward a side where the light emitting layer is located and into the spacer layer.

Or, the baffle wall extends towards a side where the light emitting layer is located and passes through the spacer layer, and the spacer layer is divided into a plurality of spacer parts by the baffle wall.

Or, the baffle wall extends toward a side where the light emitting layer is located, passes through the spacer layer and extends into the refractive layer.

In some embodiments, the light emitting layer further includes a substrate. The first light emitting part includes at least one light emitting chip. And/or the second light emitting part includes at least one light emitting chip. And/or the third light emitting part includes at least one light emitting chip, and the light emitting chip is disposed on the substrate.

In some embodiments, an emission peak wavelength of any light emitting part of the light emitting layer is in a range of [350 nm, 480 nm].

A component material of the third light processing part includes a red light conversion material, and the red light conversion material is a fluorescent material or quantum dot material with an emission peak wavelength in a range of [600 nm, 700 nm].

A component material of the second light processing part includes a green light conversion material, and the green light conversion material is a fluorescent material or quantum dot material with an emission peak wavelength in a range of [500 nm, 550 nm].

When an emission peak wavelength of the first light emitting part is in a range of [430 nm, 480 nm], the first light processing part is composed of a colorless transparent material.

Or when an emission peak wavelength of the first light emitting part is in a range of [350 nm, 430 nm], a component material of the first light processing part includes a blue light conversion material, and the blue light conversion material is a fluorescent material or quantum dot material with an emission peak wavelength in a range of [430 nm, 480 nm].

In some embodiments, the baffle wall is made of a light absorption material and/or a light reflecting material. Or a component material of the baffle wall includes a light absorption material and/or a light reflecting material. Or a light adsorption material and/or a light reflecting material are disposed on a surface of the baffle wall.

In some embodiments, the full-color light emitting device further includes an isolation layer surrounding the light emitting layer, the refractive layer, the spacer layer and the light processing layer.

In some embodiments, the isolation layer is made of a light absorption material and/or a light reflecting material. Or a component material of the isolation layer includes a light absorption material and/or a light reflecting material. Or a light adsorption material and/or a light reflecting material are disposed on a surface of the isolation layer.

In some embodiments, under a condition that the refractive layer is closely disposed above the light emitting layer, the spacer layer is closely disposed above the refractive layer, the light processing layer is closely disposed above the spacer layer, and the light emitting part and the corresponding light processing part are coaxially arranged, a refractive index $n_1$ of the refractive layer and a refractive index $n_2$ of the spacer layer meet a following constraint condition:

$$\frac{n_1}{n_2} \geq \frac{\sqrt{(d_1 - d_3)^2 + 4d_2^2}}{d_1 - d_3},$$

wherein $d_3$ is a wire diameter of the light emitting part, $d_1$ is a wire diameter of the light processing part, and $d_2$ is a thickness of the refractive layer.

Correspondingly, the disclosure also provides a display module, and the display module includes a plurality of full-color light emitting devices as described above.

The disclosure provides a full-color light emitting device. The refractive layer and the spacer layer are disposed, so that large-angle light rays in the light emitting layer are totally reflected at an interface of the refractive layer and the spacer layer, a probability that the light processing part in the light processing layer is mistakenly excited is reduced, and a color development accuracy and a display effect of the full-color light emitting device are improved. The baffle wall is disposed, so that optical crosstalk between adjacent light processing parts is prevented, and the color development accuracy and display effect of the full-color light emitting device are further enhanced. The isolation layer is disposed, so that light rays inside the device are prevented from affecting other devices, and a resolution of the full-color light emitting device is improved. The display module having the full-color light emitting device has characteristics of accurate color display, high resolution and good display effect.

BRIEF DESCRIPTION OF THE DRAWINGS

In order to more clearly explain the technical solutions in the embodiments of this disclosure or in a prior art, drawings required in the descriptions of the embodiments or the prior art will be briefly introduced below. It is apparent that the drawings in the following descriptions are only some embodiments of this disclosure. Those of ordinary skill in the art may also obtain other drawings in accordance with these drawings without paying creative labor.

DETAILED DESCRIPTION OF THE EMBODIMENTS

Clear and complete descriptions will be made on technical solutions in the embodiments of the disclosure below in combination with drawings of the embodiments of the disclosure. It is apparent that the described embodiments are a part of embodiments of the disclosure and are not all the embodiments. All other embodiments obtained by those of ordinary skill in the art based on the embodiments in the disclosure without creative labor shall fall within the scope of protection of the disclosure.

Embodiment I

Figure 1:
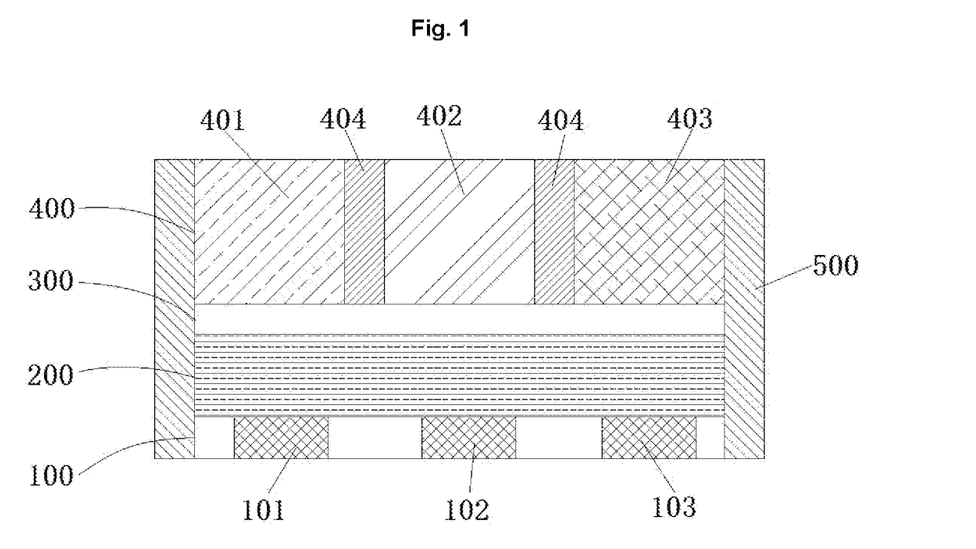
FIG. 1 illustrates a structural schematic diagram of a full-color light emitting device according to embodiment I of the disclosure.

FIG. 1 illustrates a structural schematic diagram of a full-color light emitting device according to the embodiment of the disclosure. The embodiment of the disclosure provides a full-color light emitting device. The full-color light emitting device includes a light emitting layer 100, a refractive layer 200, a spacer layer 300 and a light processing layer 400.

The refractive layer 200 is disposed above the light emitting layer 100, the spacer layer 300 is disposed above the refractive layer 200, and the light processing layer 400 is disposed above the spacer layer 300. In some embodiments, in order to reduce a thickness of the full-color light emitting device and lower a level of difficulty of processing the full-color light emitting device, adjacent layers are closely disposed.

Specifically, the light emitting layer 100 is at least provided with three light emitting parts capable of independently controlling light emission. Correspondingly, the light processing layer 400 includes light processing parts corresponding to the light emitting parts. After the light rays emitted by all the light emitting parts in one full-color light emitting device pass through the corresponding light processing parts, three primary colored beams of light of red light, green light and blue light are generated at least. After the three primary colored beams of light are mixed, a full-color display of the light emitting device is implemented.

Specifically, in the embodiment of the disclosure, the light emitting layer includes a first light emitting part 101, a second light emitting part 102 and a third light emitting part 103. The light processing layer includes a first light processing part 401 emitting a blue light ray, a second light processing part 402 emitting a green light ray and a third light processing part 403 emitting a red light ray, and a baffle wall 404 is disposed between any two adjacent light processing parts of the first light processing part 401, the second light processing part 402 and the third light processing part 403 in order to prevent optical crosstalk among different types of light processing parts from causing false excitation of the light processing parts.

In some embodiments, the baffle wall 404 is made of a light absorption material and/or a light reflecting material. Or a component material of the baffle wall 404 includes a light absorption material and/or a light reflecting material. Or a light adsorption material and/or a light reflecting material is disposed on a surface of the baffle wall 404.

In some embodiments, the baffle wall 404 is made of a black light absorption material. Or the baffle wall 404 is made of a polymer material doped with a black light absorption material. Or the baffle wall 404 is made of a transparent material, and a light reflecting layer or a light adsorption layer is arranged on an outer wall of the transparent material.

The baffle wall 404 is disposed mainly to prevent optical crosstalk between two adjacent light processing parts with different light emitting colors. Therefore, the baffle wall 404 absorbs the light rays by the light absorption material or reflects the light rays by the light reflecting material to prevent the light rays from being transmitted between two adjacent light processing parts.

In addition, in order to implement a function of the baffle wall 404, in some embodiments, a setting height of the baffle wall 404 needs to be greater than or equal to a height of the light processing parts located on both sides of the baffle wall 404, which may be designed according to requirements in specific implementation.

In the embodiment of the disclosure, the first light processing part 401 is disposed at a position corresponding to the first light emitting part 101. The second light processing part 402 is disposed at a position corresponding to the second light emitting part 102. The third light processing part 403 is disposed at a position corresponding to the third light emitting part 103.

In some embodiments, the light emitting layer further includes a substrate. The first light emitting part 101 includes more than one light emitting chip. And/or the second light emitting part 102 includes more than one light emitting chip. And/or the third light emitting part 103 includes more than one light emitting chip, and the light emitting chip is disposed on the substrate.

In some embodiments, an emission peak wavelength of any light emitting part of the light emitting layer is [350 nm, 480 nm]. Specifically, the emission peak wavelength of the light emitting chip is [350 nm, 480 nm], and the light emitting chip is a blue light chip or an ultraviolet light chip.

Component materials of the third light processing part 403 include a red light conversion material, and the red light conversion material is a fluorescent material or quantum dot material with an emission peak wavelength in a range of [600 nm, 700 nm].

Component materials of the second light processing part 402 include a green light conversion material, and the green light conversion material is a fluorescent material or quantum dot material with an emission peak wavelength in a range of [500 nm, 550 nm].

When an emission peak wavelength of the first light emitting part 101 is [430 nm, 480 nm], the first light processing part 401 is composed of a colorless transparent material.

Or when the emission peak wavelength of the first light emitting part is [350 nm, 430 nm], a component material of the first light processing part 401 includes a blue light conversion material, and the blue light conversion material is a fluorescent material or quantum dot material with an emission peak wavelength in a range of [430 nm, 480 nm].

The light emitting layer 100 and the light processing layer 400 are disposed in a cooperating mode, so that full-color light emission of the light emitting device is implemented.

When the light emitting chip with a non-special structure is employed, the light rays spread in a fan-shaped mode from a top surface of the light emitting part to the light processing layer, which may lead to false excitation of adjacent light processing parts and distortion of the light-emitting color of the light emitting device. In the embodiments of the disclosure, the refractive layer 200 and the spacer layer 300 are disposed, so as to reduce a probability that the non-corresponding light processing part is mistakenly excited.

Specifically, it is learned from a propagation principle of light in different media, that the light will be reflected and refracted according to a difference of incident angles and refractive indexes of the media when transmitted from one medium to another medium. For two adjacent media, a medium with larger refractive index is called optically denser medium, and a medium with smaller refractive index is optically thinner medium. When the light enters the optically denser medium from the optically thinner medium, the light will be refracted when the incident angle has an included angle with a normal line. Herein, the incident angle is greater than a refraction angle. According to a principle that a light path is reversible, the incident angle is less than the refraction angle when the light enters the optically thinner medium from the optically denser medium.

Therefore, when the light emitted from the light emitting layer 100 enters the refractive layer 200, the light will be refracted, and the refraction angle is smaller than the incident angle. Therefore, the refractive layer 200 has a certain focusing effect on the light of the light emitting layer 100, so that the light rays can be gathered.

In addition, the light rays will be reflected at an interface of the two medium. If entering the optically thinner medium from the optically denser medium, the light rays will be totally reflected when the incident angle of the light rays is greater than a critical angle.

Therefore, in the embodiments of the disclosure, the light refractive index of the refractive layer 200 is greater than the light refractive index of the spacer layer 300, so that the light rays larger than the critical angle will be totally reflected when the light rays enter the spacer layer 300 from the refractive layer 200, and the non-corresponding light processing part will not be mistakenly excited.

In specific implementation, due to various implementation situations, the embodiment of the disclosure is illustrated with one of typical structures.

Figure 2:
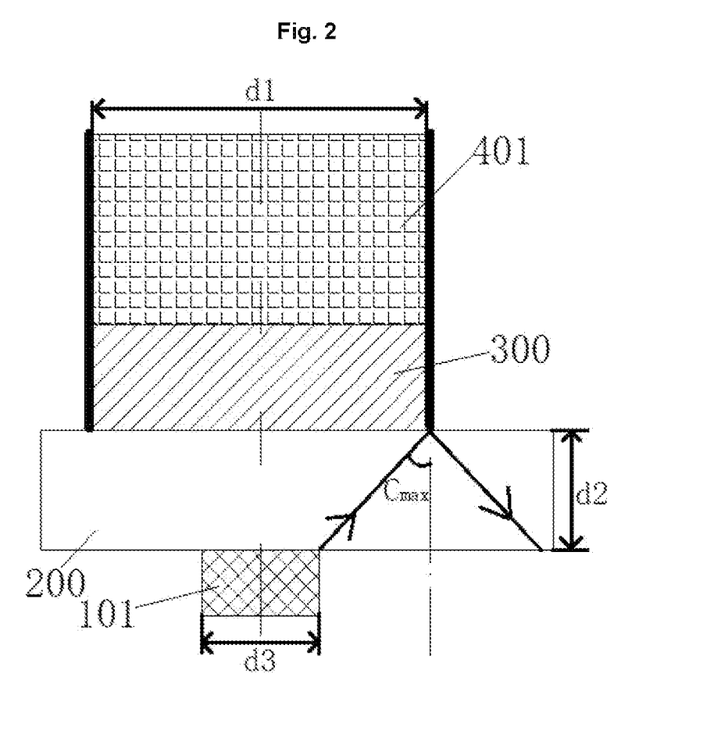
FIG. 2 illustrates a schematic diagram of principle of the full-color light emitting device according to embodiment I of the disclosure.

FIG. 2 illustrates a schematic diagram of principle of the full-color light emitting device according to the embodiment of the disclosure. In the embodiments of the disclosure, the first light emitting part 101 and the first light processing part 401 are taken as examples to explain an action principle of the refractive layer 200 and the spacer layer 300. In order to prevent the light rays from entering the adjacent light processing part (the second light processing part), large-angle light rays of the first light emitting part 101 need to be totally reflected after leaving a coverage area of the first light processing part 401. In some embodiments of the disclosure, the first light emitting part 101 and the first light processing part 401 are opposite to each other and coaxially disposed, and the coverage area of the first light processing part 401 is marked by a thick solid line in FIG. 2.

In the embodiments of the disclosure, if a wire diameter of the first light emitting part 101 is $d_3$, a wire diameter of the first light processing part 401 is $d_1$, a thickness of the refractive layer 200 is $d_2$, a refractive index of the refractive layer 200 is $n_1$, and a refractive index of the spacer layer 300 is $n_2$, a calculation formula of a maximum critical angle $C_{max}$ is:

$$\sin C_{max} = \frac{\frac{d_1 - d_3}{2}}{\sqrt{\left(\frac{d_1 - d_3}{2}\right)^2 + d_2^2}} = \frac{d_1 - d_3}{2\sqrt{\left(\frac{d_1 - d_3}{2}\right)^2 + d_2^2}}$$

A calculation formula of a critical angle C of total reflection of the light rays emitted by the refractive layer 200 and the spacer layer 300 is:

$$\sin C = \frac{n_2}{n_1}$$

Therefore, in order to enable the large-angle light rays to be totally reflected after exceeding the coverage area of the first light processing part 401 after the light rays of the first light emitting part 101 are emitted, a refractive index condition that the refractive layer 200 and the spacer layer 300 should satisfy is as follows:

$$\frac{n_1}{n_2} \geq \frac{\sqrt{(d_1 - d_3)^2 + 4d_2^2}}{d_1 - d_3}.$$

In some implementations, optionally, a lower surface of the refractive layer contacts with a light emitting chip in the light emitting part, or a lower surface of the refractive layer does not contact with a light emitting chip in the light emitting part. The above formula is only applicable to the full-color light emitting device structure in which the lower surface of the refractive layer is in contact with the light emitting chip.

In some embodiments, the refractive layer 200 includes at least two sub-refractive layers. Refractive indexes of any two adjacent sub-refractive layers of the at least two sub-refractive layers are different, and a light refractive index of an uppermost sub-refractive layer is greater than the light refractive index of the spacer layer. Through the refractive index design among different sub-refractive layers, when the light passes through each sub-refractive layer, the light rays emitted by the light emitting part can be gathered or a part of the large-angle light rays will be totally reflected, thus reducing a number of the large-angle light rays.

In some embodiments, it is learned through refractive index limiting conditions of the spacer layer and the refractive layer, that in order to make the total reflection easier and the critical angle smaller, the spacer layer 300 is a vacuum layer, and the light refractive index in a vacuum environment is 1. Or the spacer layer 300 is filled with colorless gas. Or the spacer layer 300 is filled with a material with the refractive index smaller than the refractive index of the refractive layer 200.

In the embodiment of the disclosure, the refractive layer and the spacer layer are disposed, so that the probability that the large-angle light rays enter the non-corresponding light processing part to cause false excitation of the light processing part is reduced.

In addition, in order to prevent the totally reflected light rays from entering the refractive layer again, in some embodiments, a light absorption material is disposed between any two adjacent light emitting parts of the first light emitting part, the second light emitting part and the third light emitting part. Specifically, the light absorption material is disposed on the substrate between any two adjacent light emitting parts to form a light absorption material layer. Or the light absorption material is filled between any two adjacent light emitting parts. Or the light absorption material is disposed on the lower surface, between adjacent light emitting parts, of the refractive layer to form the light absorption material layer, and the light rays totally reflected on the refractive layer and the spacer layer are absorbed by the light absorption material.

In addition, considering that the full-color light emitting device needs to be applied to a light emitting module, in order to avoid optical crosstalk between adjacent full-color light emitting devices, the full-color light emitting device in the embodiment of the disclosure is provided with an isolation layer 500 surrounding the light emitting layer 100, the refractive layer 200, the spacer layer 300 and the light processing layer 400.

In some embodiments, the isolation layer 500 is made of a light absorption material and/or a light reflecting material. Or a component material of the isolation layer includes a light absorption material and/or a light reflecting material. Or a light adsorption material and/or a light reflecting material is disposed on a surface of the isolation layer 500.

Specifically, the isolation layer 500 is made of a black light absorption material. Or the isolation layer 500 is made of a polymer material doped with the black light absorption material. Or the isolation layer 500 is made of a transparent material, and the light reflecting layer is arranged on an outer wall of the transparent material.

Embodiment II

Figure 3:
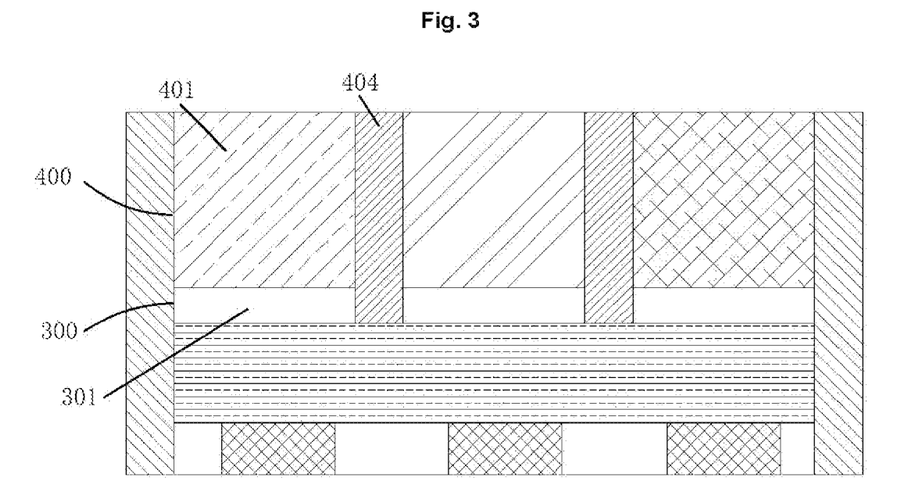
FIG. 3 illustrates a structural schematic diagram of a full-color light emitting device according to embodiment II of the disclosure.

FIG. 3 illustrates a structural schematic diagram of a full-color light emitting device according to the embodiment of the disclosure. On the basis of the embodiment I, the baffle wall 404 extends toward a side where the light emitting layer is located and into the spacer layer 300. Or the baffle wall extends toward the side where the light emitting layer is located and passes through the spacer layer 300.

According to the above embodiment, the spacer layer 300 is divided into a plurality of spacer parts corresponding to the light processing parts, such as a first spacer part 301 opposite to the first light processing part 401. Such arrangement facilitates processing. A plurality of through holes is processed in a film made of the light absorption material, and a remaining film material forms the baffle wall as required. Then, the through holes are correspondingly filled with light processing materials corresponding to the light processing parts. The light processing materials do not need to completely fill the through holes, leaving upper parts of the through holes empty to form the spacer part as required. When in use, the film is arranged upside down, so that the spacer layer and the light processing layer described in the embodiment of the disclosure are implemented.

Embodiment III

Figure 4:
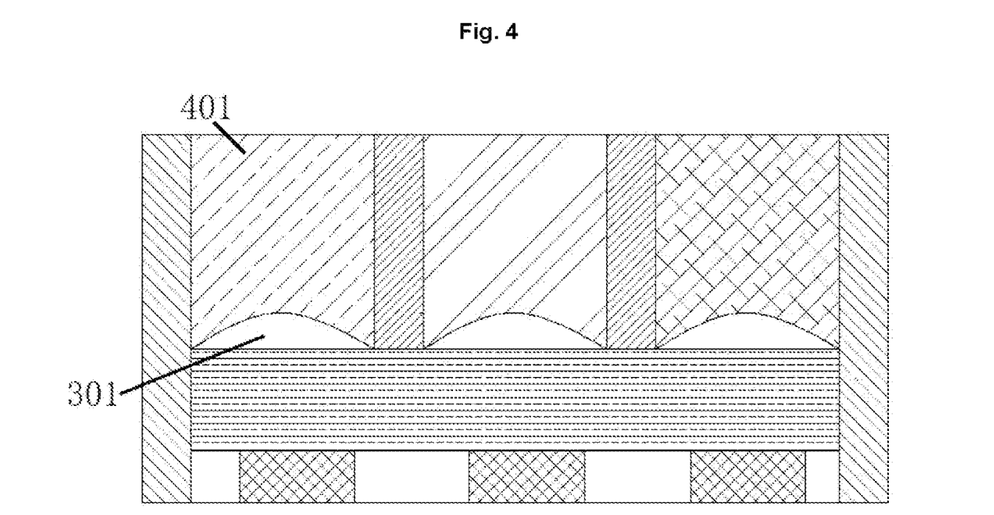
FIG. 4 illustrates a structural schematic diagram of a full-color light emitting device according to embodiment III of the disclosure.

FIG. 4 illustrates a structural schematic diagram of a full-color light emitting device according to the embodiment of the disclosure. When the film is made of a hydrophilic material (that is, when the baffle wall is made of the hydrophilic material), a light processing material generates a wetting phenomenon on a wall of the through hole before curing when the light processing material is filled into the through hole in the film. After the light processing material is cured to form the light processing part as required, a top surface of the light processing material is concave. Correspondingly, a contact surface between the spacer part and the light processing part is convex, as shown by the first light processing part 401 and the first spacer part 301 in FIG. 4 of the attached drawings. When some large-angle light rays enter the first light processing part 401 from the first spacer part 301, that is, when the light rays enter the optically denser medium from the optically thinner medium, an angle of emergence of the light rays is smaller than the incident angle, which facilitates gathering the light rays, and enables more light rays entering the first light processing part 401 to transmit from the first light processing part 401 without being absorbed by the baffle wall or the isolation layer, thus enhancing the display effect.

Embodiment IV

After the light rays are emitted from the light emitting part, with a divergence of the light rays, the farther the light processing part is from the corresponding light emitting part, the less the light rays are received by the light processing part. Therefore, in order to increase a light ray reception amount of the light processing part, in some embodiments, the baffle wall extends toward the side where the light emitting layer is located, passes through the spacer layer and extends into the refractive layer. Since an inner wall of the baffle wall is provided with a light reflecting material, the light rays are continuously reflected by the baffle wall and consequently enter the corresponding light processing part. At the same time, as a distance between the baffle wall and the light emitting part is shortened, a number of light rays from the light emitting part to the non-corresponding light processing part is reduced, which further reduces the probability that the light processing part is mistakenly excited, and has good practicability.

Correspondingly, the embodiments of the disclosure provide a display module, and the display module includes the plurality of full-color light emitting devices as described above.

The embodiments of the disclosure provide a full-color light emitting device. The refractive layer and the spacer layer are disposed, so that the large-angle light rays in the light emitting layer are totally reflected at the interface of the refractive layer and the spacer layer, the probability that the light emitting part in the light emitting layer is mistakenly excited is reduced, and a color development accuracy and display effect of the full-color light emitting device are improved. The baffle wall is disposed, so that optical crosstalk between adjacent light processing parts is prevented, and the color development accuracy and display effect of the full-color light emitting device is further enhanced. The isolation layer is disposed, so that the light rays inside the device can be prevented from affecting other devices, and a resolution of the full-color light emitting device is improved. The display module having the full-color light emitting device has the characteristics of accurate color display, high resolution and good display effect.

A full-color light emitting device and a display module provided by the embodiments of the disclosure are introduced above in detail. Herein, specific cases are used to explain the principle and implementation modes of the disclosure. The descriptions of the above embodiments are only for helping to understand the method and core idea of the disclosure. Meanwhile, for those of ordinary skill in the art, there will be variations in the specific implementation mode and application scope according to the idea of the disclosure. In conclusion, the content of the specification should not be understood as a limitation to the disclosure.

What is claimed is:

1. A full-color light emitting device, wherein the full-color light emitting device comprises a light emitting layer, a refractive layer, a spacer layer and a light processing layer,
    the refractive layer being disposed above the light emitting layer, the spacer layer being disposed above the refractive layer, and the light processing layer being disposed above the spacer layer,
    the light emitting layer comprising a first light emitting part, a second light emitting part and a third light emitting part, the light processing layer comprising a first light processing part emitting a blue light ray, a second light processing part emitting a green light ray and a third light processing part emitting a red light ray, and a baffle wall being disposed between any two adjacent light processing parts in the first light processing part, the second light processing part and the third light processing part,
    the first light processing part being disposed at a position corresponding to the first light emitting part, the second light processing part being disposed at a position corresponding to the second light emitting part, and the third light processing part being disposed at a position corresponding to the third light emitting part,
    a light refractive index of the refractive layer being greater than a light refractive index of the spacer layer;
    the baffle wall extends toward a side where the light emitting layer is located and into the spacer layer, and a contact surface between the first light processing part and the spacer layer is convex.

2. The full-color light emitting device as claimed in claim 1, wherein the spacer layer is a vacuum layer, or the spacer layer is filled with colorless gas, or the spacer layer is filled with a material with a refractive index lower than the refractive index of the refractive layer.

3. The full-color light emitting device as claimed in claim 1, wherein the refractive layer comprises at least two sub-refractive layers, refractive indexes of any two adjacent sub-refractive layers in the at least two sub-refractive layers being different, and a light refractive index of an uppermost sub-refractive layer in the at least two sub-refractive layers being greater than the light refractive index of the spacer layer.

4. The full-color light emitting device as claimed in claim 1, wherein a light absorption material is disposed between any two adjacent light emitting parts in the first light emitting part, the second light emitting part and the third light emitting part.

5. The full-color light emitting device as claimed in claim 1, wherein
    the baffle wall extends towards a side where the light emitting layer is located and passes through the spacer layer, the spacer layer being divided into a plurality of spacer parts by the baffle wall,
    or the baffle wall extends toward a side where the light emitting layer is located, passes through the spacer layer and extends into the refractive layer.

6. The full-color light emitting device as claimed in claim 1, wherein the light emitting layer further comprises a substrate, the first light emitting part comprising at least one light emitting chip, and/or the second light emitting part comprising at least one light emitting chip, and/or the third light emitting part comprising at least one light emitting chip, and the light emitting chip being disposed on the substrate.

7. The full-color light emitting device as claimed in claim 1, wherein an emission peak wavelength of any light emitting part of the light emitting layer is in a range of [350 nm, 480 nm],
- a component material of the third light processing part comprising a red light conversion material, the red light conversion material being a fluorescent material or quantum dot material with an emission peak wavelength in a range of [600 nm, 700 nm],
- a component material of the second light processing part comprising a green light conversion material, the green light conversion material being a fluorescent material or quantum dot material with an emission peak wavelength in a range of [500 nm, 550 nm],
- the first light processing part being composed of a colorless transparent material when an emission peak wavelength of the first light emitting part is in a range of [430 nm, 480 nm],
- or, a component material of the first light processing part comprising a blue light conversion material when an emission peak wavelength of the first light emitting part is in a range of [350 nm, 430 nm], and the blue light conversion material being a fluorescent material or quantum dot material with an emission peak wavelength in a range of [430 nm, 480 nm].

8. The full-color light emitting device as claimed in claim 1, wherein the baffle wall is made of a light absorption material and/or a light reflecting material, or a component material of the baffle wall comprising a light absorption material and/or a light reflecting material, or a light adsorption material and/or a light reflecting material being disposed on a surface of the baffle wall.

9. The full-color light emitting device as claimed in claim 1, wherein the full-color light emitting device further comprises an isolation layer surrounding the light emitting layer, the refractive layer, the spacer layer and the light processing layer.

10. The full-color light emitting device as claimed in claim 9, wherein the isolation layer is made of a light absorption material and/or a light reflecting material, or a component material of the isolation layer comprising a light absorption material and/or a light reflecting material, or a light adsorption material and/or a light reflecting material being disposed on a surface of the isolation layer.

11. The full-color light emitting device as claimed in claim 1, wherein under a condition that the refractive layer being closely disposed above the light emitting layer, the spacer layer being closely disposed above the refractive layer, the light processing layer being closely disposed above the spacer layer, and the light emitting part and the corresponding light processing part being coaxially disposed, wherein a refractive index $n_1$ of the refractive layer and a refractive index $n_2$ of the spacer layer meet a following constraint condition:

$$\frac{n_1}{n_2} \geq \frac{\sqrt{(d_1 - d_3)^2 + 4d_2^2}}{d_1 - d_3},$$

Wherein $d_3$ is a wire diameter of the light emitting part, $d_1$ is a wire diameter of the light processing part, and $d_2$ is a thickness of the refractive layer.

12. A display module, wherein the display module comprises a plurality of full-color light emitting devices as claimed in claim 1.

13. The display module as claimed in claim 12, wherein the spacer layer is a vacuum layer, or the spacer layer is filled with colorless gas, or the spacer layer is filled with a material with a refractive index lower than the refractive index of the refractive layer.

14. The display module as claimed in claim 12, wherein the refractive layer comprises at least two sub-refractive layers, refractive indexes of any two adjacent sub-refractive layers in the at least two sub-refractive layers being different, and a light refractive index of an uppermost sub-refractive layer in the at least two sub-refractive layers being greater than the light refractive index of the spacer layer.

15. The display module as claimed in claim 12, wherein a light absorption material is disposed between any two adjacent light emitting parts in the first light emitting part, the second light emitting part and the third light emitting part.

16. The display module as claimed in claim 12, wherein
- the baffle wall extends towards a side where the light emitting layer is located and passes through the spacer layer, the spacer layer being divided into a plurality of spacer parts by the baffle wall,
- or the baffle wall extends toward a side where the light emitting layer is located, passes through the spacer layer and extends into the refractive layer.

17. The display module as claimed in claim 12, wherein the light emitting layer further comprises a substrate, the first light emitting part comprising at least one light emitting chip, and/or the second light emitting part comprising at least one light emitting chip, and/or the third light emitting part comprising at least one light emitting chip, and the light emitting chip being disposed on the substrate.

18. The display module as claimed in claim 12, wherein an emission peak wavelength of any light emitting part of the light emitting layer is in a range of [350 nm, 480 nm],
- a component material of the third light processing part comprising a red light conversion material, the red light conversion material being a fluorescent material or quantum dot material with an emission peak wavelength in a range of [600 nm, 700 nm],
- a component material of the second light processing part comprising a green light conversion material, the green light conversion material being a fluorescent material or quantum dot material with an emission peak wavelength in a range of [500 nm, 550 nm],
- the first light processing part being composed of a colorless transparent material when an emission peak wavelength of the first light emitting part is in a range of [430 nm, 480 nm],
- or, a component material of the first light processing part comprising a blue light conversion material when an emission peak wavelength of the first light emitting part is in a range of [350 nm, 430 nm], and the blue light conversion material being a fluorescent material or quantum dot material with an emission peak wavelength in a range of [430 nm, 480 nm].

19. The display module as claimed in claim 12, wherein the full-color light emitting device further comprises an isolation layer surrounding the light emitting layer, the refractive layer, the spacer layer and the light processing layer.

20. The display module as claimed in claim 12, wherein under a condition that the refractive layer being closely disposed above the light emitting layer, the spacer layer being closely disposed above the refractive layer, the light processing layer being closely disposed above the spacer layer, and the light emitting part and the corresponding light processing part being coaxially disposed, wherein a refractive index $n_1$ of the refractive layer and a refractive index $n_2$ of the spacer layer meet a following constraint condition:

$$\frac{n_1}{n_2} \geq \frac{\sqrt{(d_1 - d_3)^2 + 4d_2^2}}{d_1 - d_3},$$

Wherein $d_3$ is a wire diameter of the light emitting part, $d_1$ is a wire diameter of the light processing part, and $d_2$ is a thickness of the refractive layer.

* * * * *